United States Patent [19]

Hatakeyama et al.

[11] Patent Number: 5,849,461
[45] Date of Patent: Dec. 15, 1998

[54] CHEMICALLY AMPLIFIED POSITIVE RESIST COMPOSITION

[75] Inventors: Jun Hatakeyama; Shigehiro Nagura; Kiyoshi Motomi; Takeshi Nagata; Toshinobu Ishihara, all of Nakakubiki-gun, Japan

[73] Assignee: Shin-Etsu Chemical Co., Ltd., Tokyo, Japan

[21] Appl. No.: 684,395

[22] Filed: Jul. 19, 1996

[30] Foreign Application Priority Data

Aug. 1, 1995 [JP] Japan .................................. 7-215367
Oct. 2, 1995 [JP] Japan .................................. 7-278385

[51] Int. Cl.$^6$ .............................. G03F 7/038; G03F 7/039
[52] U.S. Cl. .................................. 430/281.1; 430/270.1; 430/175; 430/176; 430/190; 430/192
[58] Field of Search .............................. 430/270.1, 281.1, 430/175, 176, 190, 192

[56] References Cited

U.S. PATENT DOCUMENTS

| | | | |
|---|---|---|---|
| 5,164,278 | 11/1992 | Brunsvold et al. | 430/270.1 |
| 5,314,931 | 5/1994 | Yamada et al. | 522/127 |
| 5,342,734 | 8/1994 | Lazarus et al. | 430/270.1 |
| 5,356,753 | 10/1994 | Yamada et al. | 430/270.1 |
| 5,376,497 | 12/1994 | Kawata et al. | 430/191 |
| 5,468,589 | 11/1995 | Urano et al. | 430/170 |
| 5,547,812 | 8/1996 | Collins et al. | 430/330 |
| 5,558,971 | 9/1996 | Urano et al. | 430/170 |
| 5,624,787 | 4/1997 | Watanabe et al. | 430/270.1 |
| 5,627,006 | 5/1997 | Urano et al. | 430/192 |
| 5,629,134 | 5/1997 | Oikawa et al. | 430/270.1 |

*Primary Examiner*—Cynthia Hamilton
*Attorney, Agent, or Firm*—Millen, White, Zelano & Branigan, P.C.

[57] ABSTRACT

In a chemically amplified positive resist composition comprising an organic solvent, an acid labile group-protected resin and a photoacid generator, a compound having a weight average molecular weight of 100–1,000 and at least two phenolic hydroxyl groups in a molecule wherein the hydrogen atom of the phenolic hydroxyl group is partially replaced by an acid labile group in an overall average proportion of 10–80% is blended as a dissolution controller. The resist composition is highly sensitive to actinic radiation, has improved sensitivity and resolution, and is suitable for use in a fine patterning technique and commercially acceptable.

8 Claims, No Drawings

CHEMICALLY AMPLIFIED POSITIVE RESIST COMPOSITION

BACKGROUND OF THE INVENTION

1. Field of the Invention

This invention relates to a chemically amplified positive resist composition which is highly sensitive to actinic radiation such as deep-UV, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wave-length 365 nm) as a light source, a pattern rule of about 0.5 μm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 μm or less. If a less light absorbing resist is used, it is possible to form a pattern having a side wall nearly perpendicular to the substrate.

Chemically amplified, positive working resist materials were recently developed using acid catalysts as disclosed in JP-B 27660/1990, JP-A 27829/1988, U.S. Pat. Nos. 4,491, 628 and 5,310,619. While a high illuminance KrF excimer laser can be utilized as a deep-UV light source, these materials have high sensitivity, resolution and dry etching resistance and are promising as resist materials especially suited for deep-UV lithography.

The chemically amplified, positive resist materials being known include those of the two-component system comprising an alkali-soluble organic polymer and a photoacid generator and those of the three-component system comprising an alkali-soluble organic polymer, a dissolution inhibitor having an acid labile group, and a photoacid generator. There is a desire to further improve the sensitivity and resolution of these materials.

SUMMARY OF THE INVENTION

Therefore, an object of the invention is to provide a chemically amplified positive resist composition having high sensitivity and resolution.

The present invention generally pertains to a chemically amplified, positive working resist composition comprising an organic solvent, an acid labile group-protected resin which is slightly soluble or insoluble in alkali and becomes alkali soluble by the elimination of the acid labile group, a photoacid generator, and optionally a dissolution inhibitor. We attempted to blend the resist composition with a dissolution controller in the form of a compound having a weight average molecular weight of 100 to 1,000 and at least two phenolic hydroxyl groups in a molecule wherein the hydrogen atom of the phenolic hydroxyl group is partially replaced by an acid labile group in an overall average proportion of 10 to 80%, especially a compound selected from compounds of the general formulae (1) to (9) to be defined below. Then the resulting chemically amplified positive resist composition forms a resist film which has a high contrast in dissolution rate, especially an increased dissolution rate after exposure, and a high resolution and is fully effective in fine processing, especially deep-UV lithography.

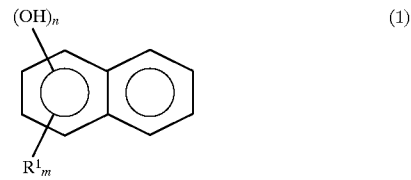

(1)

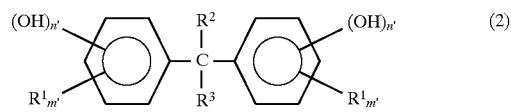

(2)

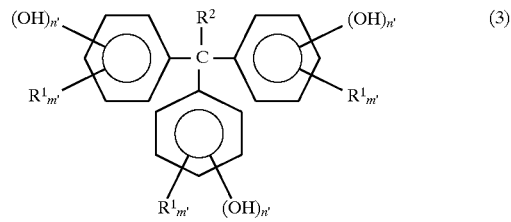

(3)

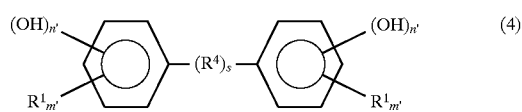

(4)

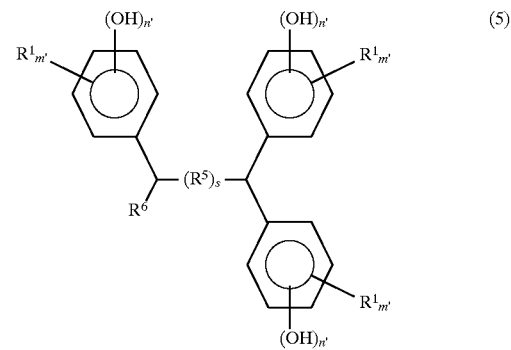

(5)

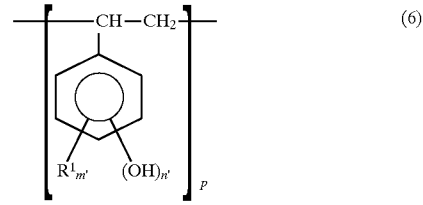

(6)

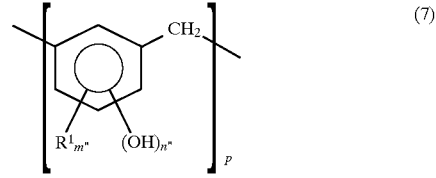

(7)

-continued

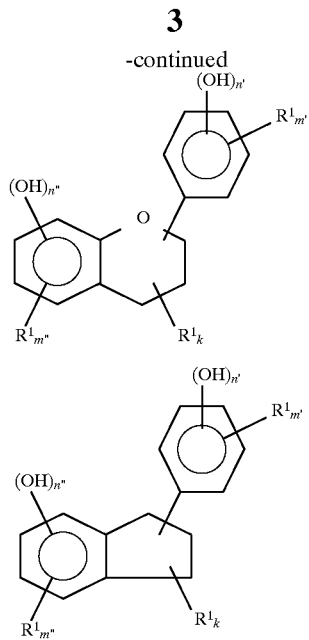

In the formulae, $R^1$ and $R^2$ are independently selected from the group consisting of hydrogen and normal or branched alkyl and alkenyl groups having 1 to 8 carbon atoms, $R^3$ is selected from the group consisting of hydrogen, normal or branched alkyl and alkenyl groups having 1 to 8 carbon atoms, and $(R^7)_s$—COOH, $R^4$ is selected from the group consisting of a group represented by —$(CH_2)_t$— wherein t is an integer of 2 to 10, arylene group having 6 to 10 carbon atoms, carbonyl group, sulfonyl group, oxygen atom, and sulfur atom, $R^5$ is selected from the group consisting of an alkylene group having 1 to 10 carbon atoms, arylene group having 6 to 10 carbon atoms, carbonyl group, sulfonyl group, oxygen atom, and sulfur atom, $R^6$ is selected from the group consisting of an alkyl group having 1 to 8 carbon atoms, alkenyl group, hydrogen atom, hydroxyl-substituted phenyl and naphthyl groups, $R^7$ is a normal or branched alkylene group having 1 to 10 carbon atoms, letter k is an integer of 0 to 5, s is 0 or 1, m, n, m', n', m", and n" are numbers satisfying m+n=8, m'+n'=5, and m"+n"=4 such that at least one hydroxyl group is attached to each phenyl skeleton, and p is such a number of at least 2 as to provide a weight average molecular weight of 100 to 1,000.

The dissolution controller according to the invention in the form of a compound having a phenolic hydroxyl group wherein the hydrogen atom of the phenolic hydroxyl group is partially replaced by an acid labile group is well compatible with an acid labile group-protected resin which is slightly soluble or insoluble in alkali and becomes alkali soluble by the elimination of the acid labile group, especially a polyhydroxystyrene of the general formula (10) to be defined below, a dissolution inhibitor, and a photoacid generator. Then the dissolution controller increases the dispersion of the photoacid generator and dissolution inhibitor to increase the density of the matrix, achieving microscopically uniform and controlled migration of the acid generated upon exposure. This, in turn, improves resolution and rectangularity after patterning and minimizes micro-scum left on the substrate surface and micro-roughness of the pattern. As a result, there is obtained a resist pattern having high resolution and few irregularities or minimized edge roughness. Therefore, the dissolution controller constitutes one component of a chemically amplified positive resist composition based on a new concept which is unknown in the art.

Accordingly, the present invention in a first aspect provides a chemically amplified positive resist composition comprising as a dissolution controller a compound having a weight average molecular weight of 100 to 1,000 and at least two phenolic hydroxyl groups in a molecule, the hydrogen atom of the phenolic hydroxyl group being partially replaced by an acid labile group in an overall average proportion of 10 to 80%. The compound having at least two phenolic hydroxyl groups is preferably selected from the group consisting of compounds of formulae (1) to (9) and mixtures thereof.

In a second aspect, the present invention provides a chemically amplified positive resist composition comprising (A) an organic solvent, (B) an acid labile group-protected resin which is slightly soluble or insoluble in alkali and becomes alkali soluble by the elimination of the acid labile group, (C) a dissolution inhibitor, (D) a photoacid generator, and (E) a dissolution controller as defined above.

DETAILED DESCRIPTION OF THE INVENTION

In the chemical amplification type positive working resist composition of the present invention, a compound having at least two phenolic hydroxyl groups in a molecule wherein the hydrogen atom of the phenolic hydroxyl group is partially replaced by an acid labile group in an overall average proportion of 10 to 80% is blended as a dissolution controller. The compound has a weight average molecular weight of 100 to 1,000, preferably 150 to 800. The degree of partial replacement of the hydrogen of phenolic hydroxyl group by an acid labile group is on average 10 to 80%, preferably 30 to 75% of the overall phenolic hydroxyl groups. A degree of substitution of less than 10% would cause edge roughness whereas a degree of substitution of more than 80% would result in low resolution.

The compound having phenolic hydroxyl groups is selected from the group consisting of compounds of the following general formulae (1) to (9) and mixtures thereof.

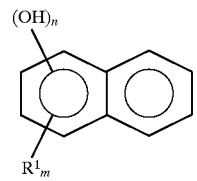

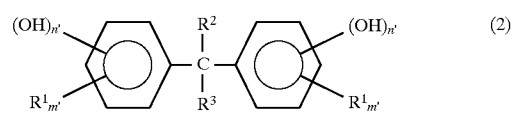

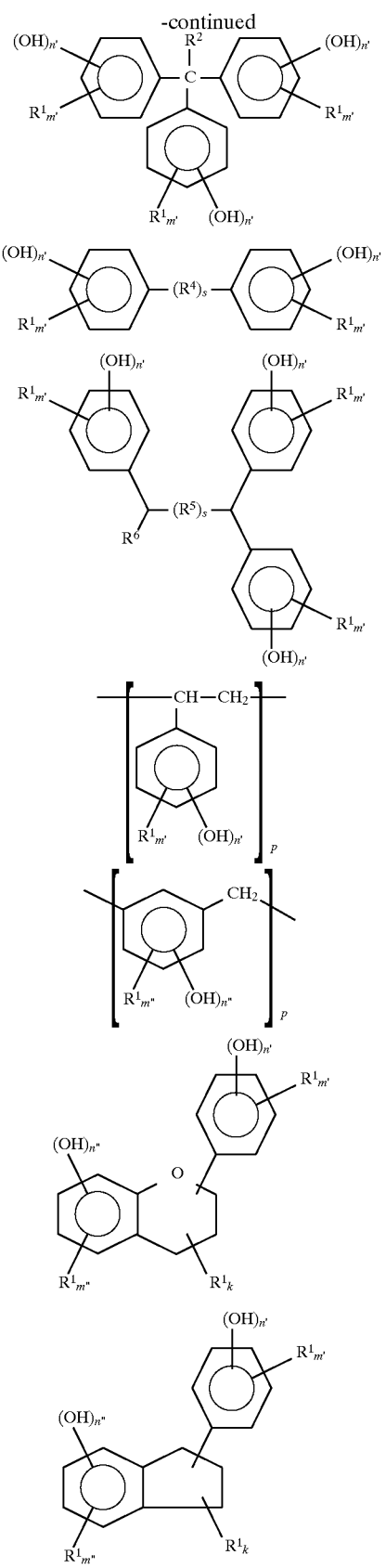

In the formulae, $R^1$ and $R^2$ are independently selected from the group consisting of hydrogen and normal or branched alkyl and alkenyl groups having 1 to 8 carbon atoms, $R^3$ is selected from the group consisting of hydrogen, normal or branched alkyl and alkenyl groups having 1 to 8 carbon atoms, and $(R^7)_s$—COOH, $R^4$ is selected from the group consisting of a group represented by —$(CH_2)_t$— wherein t is an integer of 2 to 10, arylene group having 6 to 10 carbon atoms, carbonyl group, sulfonyl group, oxygen atom, and sulfur atom, $R^5$ is selected from the group consisting of an alkylene group having 1 to 10 carbon atoms, arylene group having 6 to 10 carbon atoms, carbonyl group, sulfonyl group, oxygen atom, and sulfur atom, $R^7$ is a normal or branched alkylene group having 1 to 10 carbon atoms, letter k is an integer of 0 to 5, s is 0 or 1, m, n, m', n', m", and n" are numbers satisfying m+n=8, m'+n'=5, and m"+n"=4 such that at least two hydroxyl groups are contained in an overall molecule, and p is such a number of at least 2 as to provide a weight average molecular weight of 100 to 1,000.

Exemplary groups of R's are as follows. Exemplary groups of $R^1$ and $R^2$ are hydrogen, methyl, ethyl, butyl, propyl, ethynyl, and cyclohexyl groups. Exemplary groups of $R^3$ are the same groups as described for $R^1$ and $R^2$, —COOH, —CH$_2$COOH and —CH$_2$CH$_2$COOH. Exemplary groups of $R^4$ and $R^5$ are methylene, ethylene,

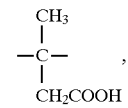

phenylene, carbonyl, sulfonyl, oxygen atom, and sulfur atom. Exemplary groups of $R^6$ are methyl, ethyl, butyl, propyl, ethynyl, cyclohexyl, hydrogen atom, hydroxyl-substituted phenyl, and hydroxyl-substituted naphthyl.

The acid labile groups used herein include groups of the general formulae (11) and (12) shown below as well as linear or branched alkyl groups having 1 to 8 carbon atoms such as tert-butyl group, tetrahydropyranyl, tetrahydrofuranyl, trialkylsilyl, and β-ketoalkyl groups.

In the formulae, $R^8$ and $R^9$ are independently hydrogen or a linear or branched alkyl group having 1 to 6 carbon atoms, $R^{10}$ is a linear, branched or cyclic alkyl group having 1 to 10 carbon atoms, $R^{11}$ is a linear or branched alkyl group having 1 to 6 carbon atoms, and letter x is equal to 0 or 1.

Examples of the linear or branched alkyl group include methyl, ethyl, propyl, isopropyl, n-butyl, iso-butyl, and tert-butyl groups. Cyclohexyl is typical of the cyclic alkyl group.

As the acid labile group represented by formula (11), methoxyethyl, ethoxyethyl, n-propoxyethyl, iso-propoxyethyl, n-butoxyethyl, iso-butoxyethyl, tert-butoxyethyl, cyclohexyloxyethyl, methoxypropyl, ethoxypropyl, 1-methoxy-1-methyl-ethyl, and 1-ethoxy-1-methyl-ethyl groups are exemplified.

As the acid labile group represented by formula (12), tert-butoxycarbonyl and tert-butoxycarbonyl-methyl groups are exemplified.

The trialkylsilyl group is preferably one in which each alkyl group has 1 to 6 carbon atoms. The alkyl groups are identical or different. Examples of the trialkylsilyl groups include trimethylsilyl and tert-butyldimethyl-silyl groups.

The β-ketoalkyl group is preferably one in which the alkyl group has 1 to 6 carbon atoms.

Among the above-said acid labile groups, ethoxyethyl group, ethoxyisopropyl group, ethoxyisobutyl group, n-propoxyethyl group, iso-propoxyethyl group, n-butoxyethyl group, iso-butoxyethyl group, tert-butoxyethyl group, tert-butoxycarbonyl group, and tert-butoxycarbonylmethyl group are preferred, although not limited thereto.

The compound having phenolic hydroxyl groups partially replaced by acid labile groups is preferably blended as a dissolution controller in the resist composition in an amount of about 0.1 to 50 parts, more preferably about 1 to 30 parts by weight per 100 parts by weight of an acid labile group-protected resin which is slightly soluble or insoluble in alkali and becomes alkali soluble by the elimination of the acid labile group to be described later. On this basis, less than 5 parts of the dissolution controller would be less effective for improving resolution whereas more than 50 parts of the dissolution controller would result in thinning of pattern film and low resolution. It is noted that the compound may be used alone or in admixture of two or more as the dissolution controller.

The resist composition of the invention may be formulated as a chemically amplified positive resist composition of the known two- or three-component system. The above-mentioned dissolution controller may be blended in a resist composition comprising an organic solvent, an acid labile group-protected resin which is slightly soluble or insoluble in alkali and becomes alkali soluble by the elimination of the acid labile group as a base polymer, a photoacid generator, and optionally a dissolution inhibitor.

Examples of the organic solvent include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more. The preferred solvents are diethylene glycol dimethyl ether and 1-ethoxy-2-propanol because the acid generator of the resist composition is most soluble therein. The amount of the organic solvent used is generally about 200 to 1,000 parts, preferably about 400 to 800 parts by weight per 100 parts by weight of the acid labile group-protected resin. Compositions with less than 200 parts of the solvent would somewhat lack mutual miscibility of the components and film formability. Compositions with more than 1,000 parts of the solvent would form too thin films which are unacceptable in practice.

The acid labile group-protected resin as a base resin is preferably a polyhydroxystyrene of the following general formula (10) having a weight average molecular weight of 1,000 to 50,000, the hydrogen atom of the hydroxyl group in a molecule being partially protected by an acid labile group such that a degree of protection or substitution represented by q/(q+r) ranges from 0.05 to 0.8.

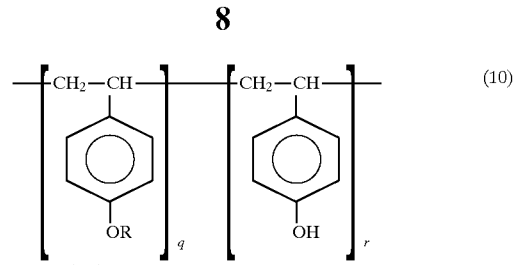

In formula (10), R is an acid labile group and letters q and r are such numbers that q/(q+r) is from 0.05 to 0.8.

The acid labile group represented by R in formula (10) is the same acid labile group as explained above and includes the groups of formulae (11) and (12), linear or branched alkyl group having 1 to 8 carbon atoms such as tert-butyl, tetrahydropyranyl, tetrahydrofuranyl, trialkylsilyl, and β-ketoalkyl groups.

Letters q and r are such numbers that q/(q+r) representing a degree of protection or substitution is from 0.05 to 0.8, preferably from 0.1 to 0.5. Within this range, hydroxyl groups are partially replaced by acid labile groups. Differently stated, a polyhydroxystyrene having a degree of substitution by an acid labile group of 5 to 80 mol %, especially 10 to 50 mol % is used.

The acid labile group-protected resin preferably has a weight average molecular weight of about 1,000 to about 50,000, more preferably about 2,000 to about 30,000. If the weight average molecular weight and the degree of substitution are outside the above-mentioned ranges, there would result a less delimited pattern profile and lower sensitivity.

The photoacid generator may be selected from well-known ones including onium salts, sulfonates and diazosulfones. Preferred are onium salts, for example, triphenylsulfonium triflates and triphenylsulfonium tosylates. The amount of the acid generator used is generally about 1 to 20 parts, preferably about 2 to 10 parts by weight per 100 parts by weight of the acid labile group-protected resin.

If desired, a dissolution inhibitor is added to the resist composition of the invention. The dissolution inhibitor used herein should preferably have at least acid labile group in a molecule. It may be selected from well-known dissolution inhibitors, for example, bisphenol A derivatives and phenolphthalein derivatives, with those wherein the hydrogen of a hydroxyl group is replaced by a tert-butoxycarbonyl group being preferred. The amount of the dissolution inhibitor used is generally about 5 to 50 parts, preferably about 10 to 30 parts by weight per 100 parts by weight of the acid labile group-protected resin.

The resist composition of the invention may further contain various additives, for example, a nitrogenous compound for improving environmental stability, a surface-active agent for facilitating coating, and a light-absorbing agent for reducing irregular reflection from the substrate, all in conventional amounts.

Typical nitrogenous compounds are amine and amide compounds having a boiling point of 150° C. or higher. Examples include aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methyl pyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and triazines such as 2-(p-chlorophenyl)-4,6-trichloromethyl-s-triazine. Preferred among others are pyrrolidone, N-methylpyrrolidone, o-, m- and p-aminobenzoic acid, 1,2-, 1,3- and 1,4-phenylenediamine.

Examples of the surfactant include perfluoroalkylpolyoxyethylene ethanols, fluorinated alkyl esters, perfluoroalkylamine oxides, and perfluoroalkyl EO addition products. Examples of the light-absorbing agent include diaryl sulfoxides, diaryl sulfones, 9,10-dimethylanthracene, and 9-fluorenone.

Any well-known lithography may be used to form a resist pattern from a positive resist composition of the invention. For example, the resist composition is spin coated onto a silicon wafer, prebaked at 80° to 120° C. for 30 to 200 seconds to form a resist film of 0.5 to 2.0 μm thick, exposed to actinic radiation such as deep-UV, electron beam, and X-ray, and baked at 70° to 120° C. for 30 to 200 seconds (post-exposure baking=PEB), and developed with an aqueous base solution. The resist composition of the invention is especially suitable for fine patterning with deep-UV radiation of 254 to 193 nm and electron beams.

There has been described a chemically amplified positive resist composition which is highly sensitive to actinic radiation such as deep-ultraviolet radiation, electron beam and X-ray, especially KrF excimer laser light, has improved sensitivity, resolution and plasma etching resistance. The resulting resist pattern is fully resistant to heat. This high resolution resist composition is suitable for use in a fine patterning technique and commercially acceptable.

EXAMPLE

Examples of the present invention are given below by way of illustration and not by way of limitation. All parts are by weight.

Examples 1–20 and Comparative Examples 1–32

Liquid resist compositions were prepared by dissolving a dissolution controller, an acid labile group-protected resin, a photoacid generator, and a dissolution inhibitor in a solvent in accordance with the formulation shown in Tables 1 to 2.

Each of the compositions was passed through a 0.2-μm Teflone® filter.

The dissolution controllers used were compounds (i) to (xiii) shown below wherein the hydrogen atom of a phenolic hydroxyl group is partially replaced by an acid labile group at an overall average degree of substitution as reported in Tables 1 to 2.

The acid labile group-protected resins used were polyhydroxystyrenes, designated Polymers 1 to 4, in which some hydroxyl groups are protected with tert-butoxycarbonyl, tert-butoxy, and tetrahydropyranyl groups, respectively.

The photoacid generators used were PAG1 to PAG4 shown below.

The dissolution inhibitor used was DRI shown below.

The solvent used was 1-ethoxy-2-propanol (EIPA).

Each liquid resist composition was then spin coated onto a silicon wafer to form a coating of 0.8 μm thick. With the silicon wafer rested on a hot plate at 100° C., the coating was pre-baked for 90 seconds. The film was exposed to a pattern of light by means of an excimer laser stepper model NSR-2005EX8A (manufactured by Nikon K. K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure quantity with which the top and bottom of a 0.35-μm line-and-space pattern were resolved at 1:1 was the optimum exposure (sensitivity Eop), the minimum line width of a line-and-space pattern which was recognized separate at this exposure was the resolution of a test resist. The configuration of the resist pattern resolved was observed under a scanning electron microscope. The edge roughness of a 0.25 μm line-and-space pattern was also observed under a scanning electron microscope.

The results are shown in Tables 1 to 2.

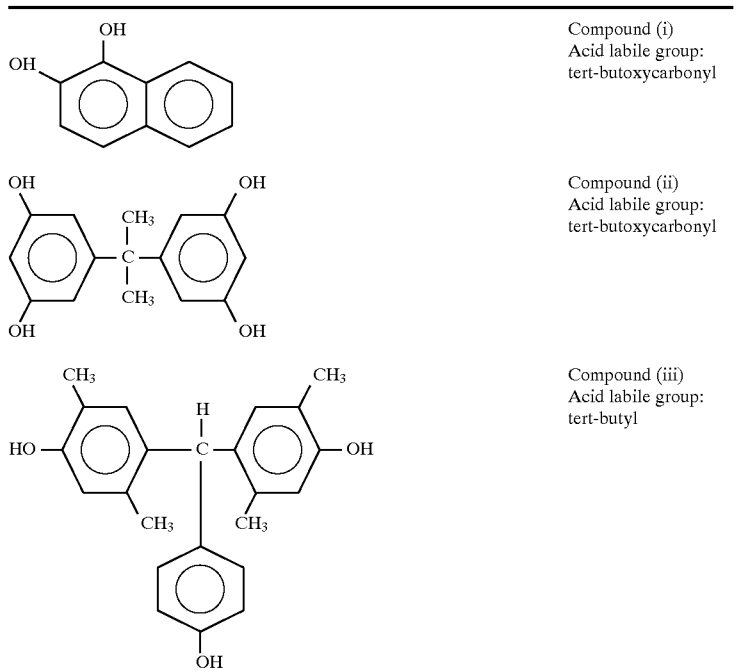

Compound (i)
Acid labile group: tert-butoxycarbonyl

Compound (ii)
Acid labile group: tert-butoxycarbonyl

Compound (iii)
Acid labile group: tert-butyl

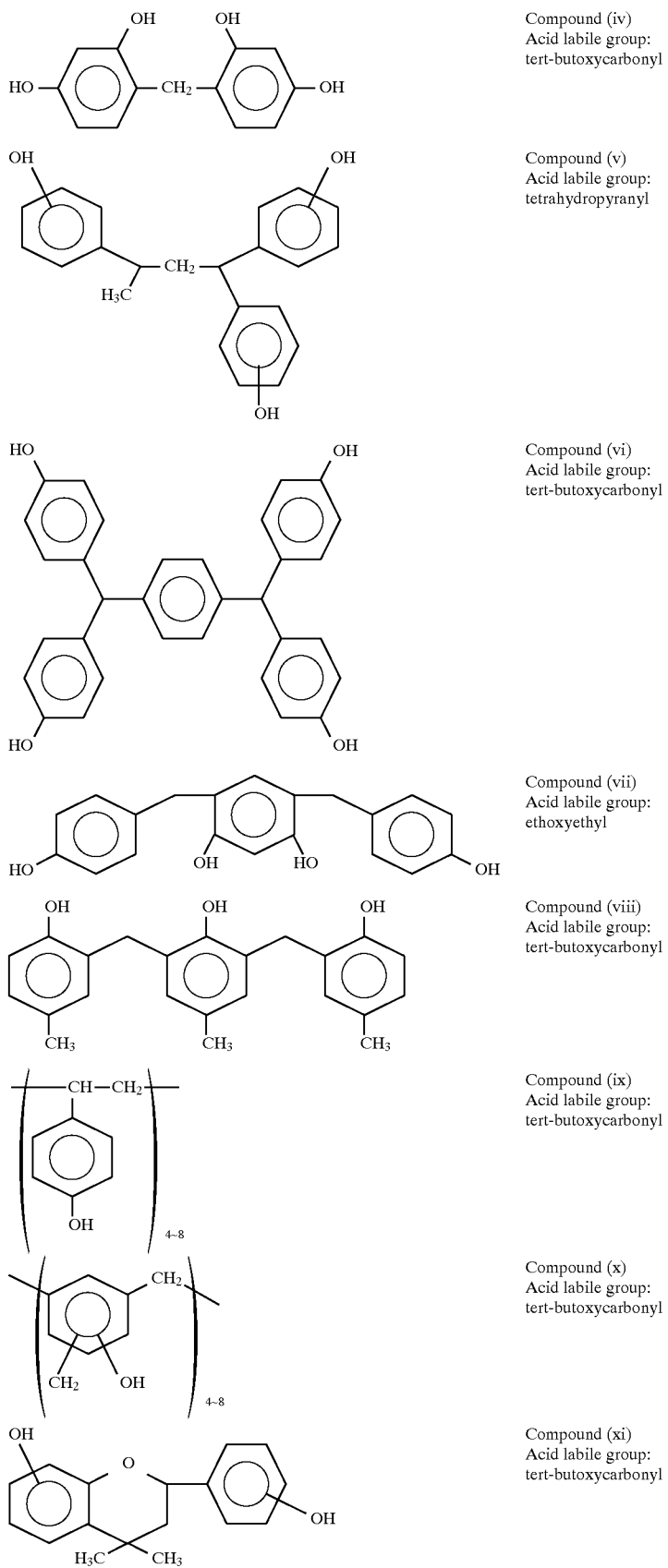

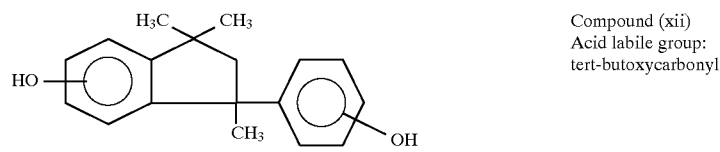
Compound (xii)
Acid labile group: tert-butoxycarbonyl
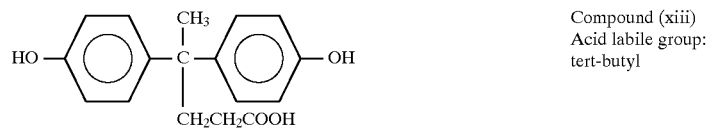
Compound (xiii)
Acid labile group: tert-butyl
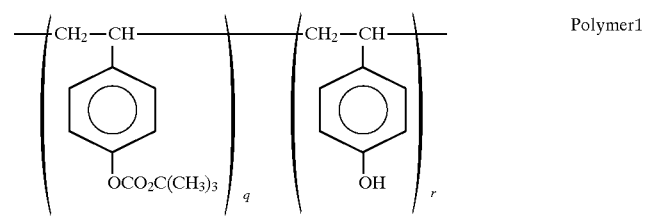
Polymer1
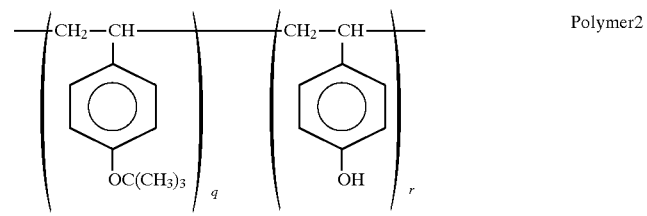
Polymer2
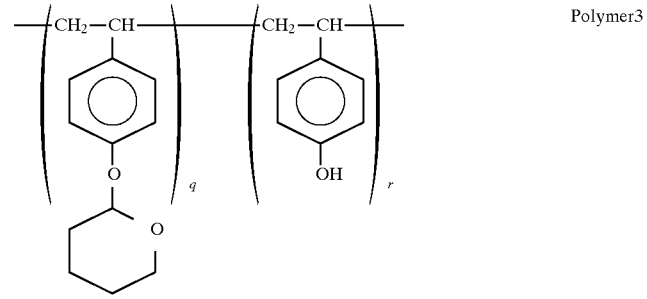
Polymer3
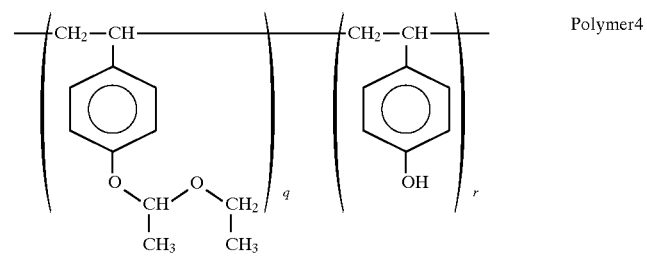
Polymer4
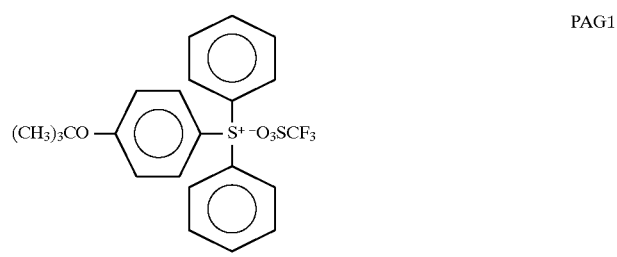
PAG1

-continued

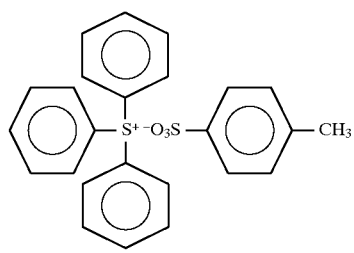
PAG2

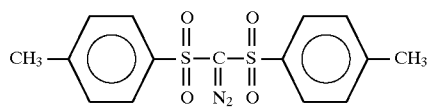
PAG3

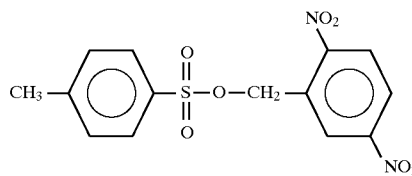
PAG4

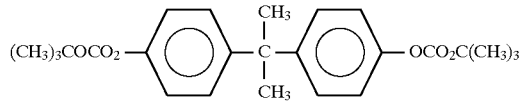
DRI

TABLE 1

| | Resist composition, pbw in parentheses | | | | | | | | | |
|---|---|---|---|---|---|---|---|---|---|---|
| | Dissolution controller | | Acid labile group-protected resin | | | | | | | Edge |
| Example | Type | Substi-tution* | Type | Mw | q/(q + r) | Photoacid generator | Dissolution inhibitor | Solvent | Resolution (μm) | roughness (nm) |
| E1 | Compound i (20) | 50 | Polymer 1 | 11000 (60) | 0.12 | PAG1 (5) | DRI (14) | EIPA (300) | 0.22 | 5 |
| E2 | Compound ii (20) | 50 | Polymer 1 | 11000 (60) | 0.12 | PAG1 (5) | DRI (14) | EIPA (300) | 0.22 | 5 |
| E3 | Compound iii (20) | 33 | Polymer 1 | 11000 (60) | 0.12 | PAG1 (5) | DRI (14) | EIPA (300) | 0.22 | 5 |
| E4 | Compound iv (20) | 50 | Polymer 1 | 11000 (60) | 0.12 | PAG1 (5) | DRI (14) | EIPA (300) | 0.22 | 5 |
| E5 | Compound v (20) | 33 | Polymer 1 | 11000 (60) | 0.12 | PAG1 (5) | DRI (14) | EIPA (300) | 0.20 | 4 |
| E6 | Compound vi (20) | 50 | Polymer 1 | 11000 (60) | 0.12 | PAG1 (5) | DRI (14) | EIPA (300) | 0.20 | 4 |
| E7 | Compound vii (20) | 50 | Polymer 1 | 11000 (60) | 0.12 | PAG1 (5) | DRI (14) | EIPA (300) | 0.22 | 5 |
| E8 | Compound viii (20) | 33 | Polymer 1 | 11000 (60) | 0.12 | PAG1 (5) | DRI (14) | EIPA (300) | 0.22 | 5 |
| E9 | Compound ix (20) | 50 | Polymer 1 | 11000 (60) | 0.12 | PAG1 (5) | DRI (14) | EIPA (300) | 0.22 | 5 |
| E10 | Compound x (20) | 50 | Polymer 1 | 11000 (60) | 0.12 | PAG1 (5) | DRI (14) | EIPA (300) | 0.22 | 5 |
| E11 | Compound xi (20) | 50 | Polymer 1 | 11000 (60) | 0.12 | PAG1 (5) | DRI (14) | EIPA (300) | 0.22 | 5 |
| E12 | Compound xii (20) | 50 | Polymer 1 | 11000 (60) | 0.12 | PAG1 (5) | DRI (14) | EIPA (300) | 0.22 | 5 |
| E13 | Compound iii (20) | 50 | Polymer 2 | 11000 (60) | 0.12 | PAG1 (5) | DRI (14) | EIPA (300) | 0.24 | 7 |
| E14 | Compound iii (20) | 50 | Polymer 3 | 11000 (60) | 0.12 | PAG1 (5) | DRI (14) | EIPA (300) | 0.24 | 7 |
| E15 | Compound iii (20) | 50 | Polymer 1 | 11000 (60) | 0.12 | PAG2 (5) | DRI (14) | EIPA (300) | 0.24 | 7 |
| E16 | Compound iii (20) | 50 | Polymer 1 | 11000 (60) | 0.12 | PAG3 (5) | DRI (14) | EIPA (300) | 0.24 | 7 |
| E17 | Compound iii (20) | 50 | Polymer 1 | 11000 (60) | 0.12 | PAG4 (5) | DRI (14) | EIPA (300) | 0.24 | 6 |

TABLE 1-continued

| Example | Dissolution controller Type | Substi- tution* | Acid labile group- protected resin Type | Mw | q/(q + r) | Photoacid generator | Dissolution inhibitor | Solvent | Resolution (μm) | Edge roughness (nm) |
|---|---|---|---|---|---|---|---|---|---|---|
| E18 | Compound iii (34) | 50 | Polymer 1 | 11000 (60) | 0.18 | PAG4 (5) | — (300) | EIPA | 0.24 | 6 |
| E19 | Compound i (20) | 50 | Polymer 4 | 11000 (60) | 0.32 | PAG2 (5) | DRI (14) | EIPA (300) | 0.24 | 7 |
| E20 | Compound xiii (20) | 50 | Polymer 4 | 11000 (60) | 0.32 | PAG2 (5) | — (300) | EIPA | 0.24 | 4 |

*Degree of substitution (%)

TABLE 2

| Comparative Example | Dissolution controller Type | Substi- tution* | Acid labile group- protected resin Type | Mw | q/(q + r) | Photoacid generator | Dissolution inhibitor | Solvent | Resolution (μm) | Edge roughness (nm) |
|---|---|---|---|---|---|---|---|---|---|---|
| CE1 | — | — | Polymer 1 | 11000 (80) | 0.12 | PAG1 (5) | DRI (14) | EIPA (300) | 0.24 | 12 |
| CE2 | — | — | Polymer 2 | 11000 (80) | 0.12 | PAG1 (5) | DRI (14) | EIPA (300) | 0.26 | 14 |
| CE3 | — | — | Polymer 3 | 11000 (80) | 0.12 | PAG1 (5) | DRI (14) | EIPA (300) | 0.26 | 13 |
| CE4 | — | — | Polymer 4 | 11000 (80) | 0.12 | PAG1 (5) | DRI (14) | EIPA (300) | 0.26 | 13 |
| CE5 | — | — | Polymer 1 | 11000 (80) | 0.12 | PAG2 (5) | DRI (14) | EIPA (300) | 0.26 | 14 |
| CE6 | — | — | Polymer 1 | 11000 (80) | 0.12 | PAG3 (5) | DRI (14) | EIPA (300) | 0.26 | 14 |
| CE7 | — | — | Polymer 1 | 11000 (80) | 0.12 | PAG4 (5) | DRI (14) | EIPA (300) | 0.26 | 14 |
| CE8 | Compound i (20) | 0 | Polymer 1 | 11000 (60) | 0.12 | PAG1 (5) | DRI (14) | EIPA (300) | 0.24 | 20 |
| CE9 | Compound ii (20) | 0 | Polymer 1 | 11000 (60) | 0.12 | PAG1 (5) | DRI (14) | EIPA (300) | 0.24 | 20 |
| CE10 | Compound iii (20) | 0 | Polymer 1 | 11000 (80) | 0.12 | PAG1 (5) | DRI (14) | EIPA (300) | 0.24 | 20 |
| CE11 | Compound iv (20) | 0 | Polymer 1 | 11000 (60) | 0.12 | PAG1 (5) | DRI (14) | EIPA (300) | 0.24 | 20 |
| CE12 | Compound v (20) | 0 | Polymer 1 | 11000 (60) | 0.12 | PAG1 (5) | DRI (14) | EIPA (300) | 0.24 | 20 |
| CE13 | Compound vi (20) | 0 | Polymer 1 | 11000 (80) | 0.12 | PAG1 (5) | DRI (14) | EIPA (300) | 0.24 | 22 |
| CE14 | Compound vii (20) | 0 | Polymer 1 | 11000 (60) | 0.12 | PAG1 (5) | DRI (14) | EIPA (300) | 0.24 | 18 |
| CE15 | Compound viii (20) | 0 | Polymer 1 | 11000 (80) | 0.12 | PAG1 (5) | DRI (14) | EIPA (300) | 0.24 | 20 |
| CE16 | Compound ix (20) | 0 | Polymer 1 | 11000 (60) | 0.12 | PAG1 (5) | DRI (14) | EIPA (300) | 0.24 | 22 |
| CE17 | Compound x (20) | 0 | Polymer 1 | 11000 (60) | 0.12 | PAG1 (5) | DRI (14) | EIPA (300) | 0.24 | 20 |
| CE18 | Compound xi (20) | 0 | Polymer 1 | 11000 (60) | 0.12 | PAG1 (5) | DRI (14) | EIPA (300) | 0.24 | 19 |
| CE19 | Compound xii (20) | 0 | Polymer 1 | 11000 (60) | 0.12 | PAG1 (5) | DRI (14) | EIPA (300) | 0.24 | 22 |
| CE20 | Compound i (20) | 100 | Polymer 1 | 11000 (60) | 0.12 | PAG1 (5) | DRI (14) | EIPA (300) | 0.28 | 15 |
| CE21 | Compound ii (20) | 100 | Polymer 1 | 11000 (60) | 0.12 | PAG1 (5) | DRI (14) | EIPA (300) | 0.28 | 15 |
| CE22 | Compound iii (20) | 100 | Polymer 1 | 11000 (60) | 0.12 | PAG1 (5) | DRI (14) | EIPA (300) | 0.28 | 16 |
| CE23 | Compound iv (20) | 100 | Polymer 1 | 11000 (60) | 0.12 | PAG1 (5) | DRI (14) | EIPA (300) | 0.28 | 16 |
| CE24 | Compound v (20) | 100 | Polymer 1 | 11000 (60) | 0.12 | PAG1 (5) | DRI (14) | EIPA (300) | 0.26 | 16 |

TABLE 2-continued

| | Dissolution controller | | Acid labile group-protected resin | | | Photoacid generator | Dissolution inhibitor | Solvent | Resolution ($\mu$m) | Edge roughness (nm) |
|---|---|---|---|---|---|---|---|---|---|---|
| Comparative Example | Type | Substitution* | Type | Mw | q/(q + r) | | | | | |
| CE25 | Compound vi (20) | 100 | Polymer 1 | 11000 (60) | 0.12 | PAG1 (5) | DRI (14) | EIPA (300) | 0.28 | 14 |
| CE26 | Compound vii (20) | 100 | Polymer 1 | 11000 (60) | 0.12 | PAG1 (5) | DRI (14) | EIPA (300) | 0.28 | 15 |
| CE27 | Compound viii (20) | 100 | Polymer 1 | 11000 (60) | 0.12 | PAG1 (5) | DRI (14) | EIPA (300) | 0.28 | 15 |
| CE28 | Compound ix (20) | 100 | Polymer 1 | 11000 (60) | 0.12 | PAG1 (5) | DRI (14) | EIPA (300) | 0.28 | 16 |
| CE29 | Compound x (20) | 100 | Polymer 1 | 11000 (60) | 0.12 | PAG1 (5) | DRI (14) | EIPA (300) | 0.28 | 16 |
| CE30 | Compound xi (20) | 100 | Polymer 1 | 11000 (60) | 0.12 | PAG1 (5) | DRI (14) | EIPA (300) | 0.28 | 15 |
| CE31 | Compound xii (20) | 100 | Polymer 1 | 11000 (60) | 0.12 | PAG1 (5) | DRI (14) | EIPA (300) | 0.28 | 15 |
| CE32 | — | — | Polymer 1 | 11000 (80) | 0.18 | PAG1 (5) | — | EIPA (300) | 0.26 | 15 |

It is evident that chemically amplified positive resist compositions within the scope of the invention have high resolution and afford patterned resist films with minimized edge roughness.

Japanese Patent Application No. 278385/1995 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising (A) an organic solvent, (B) an acid labile group-protected resin which is slightly soluble or insoluble in alkali and becomes alkali soluble by elimination of the acid labile group, (C) a dissolution inhibitor, (D) a photoacid generator, (E) a dissolution controller, said dissolution controller being a compound having a weight average molecular weight of 100 to 1,000 and at least two phenolic groups in a molecule selected from the group consisting of compounds of the following general formulae (1) to (9):

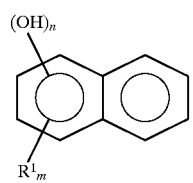
(1)

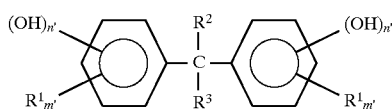
(2)

-continued

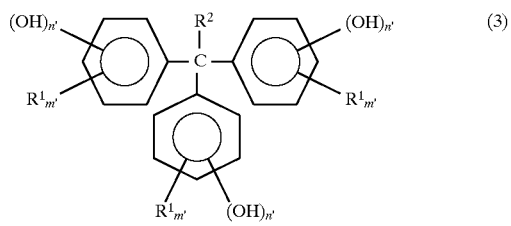
(3)

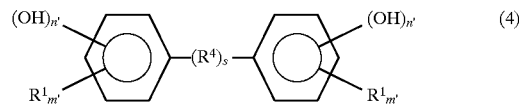
(4)

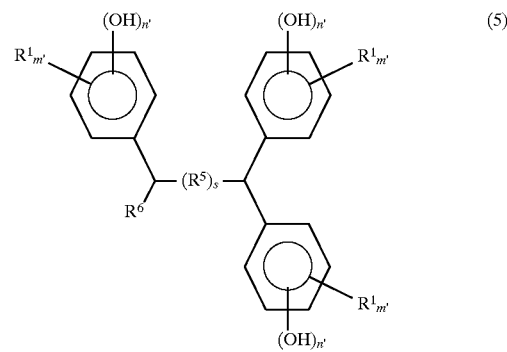
(5)

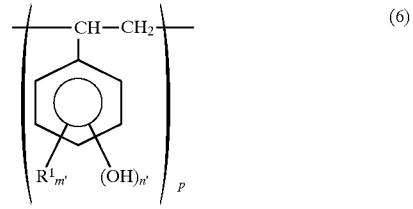
(6)

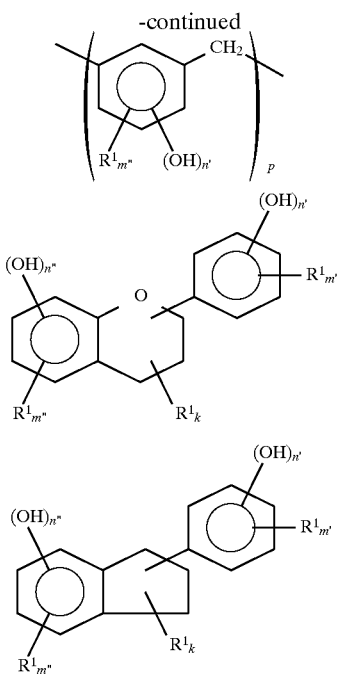

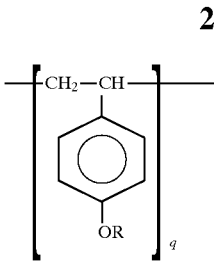

wherein R is an acid labile group and letters q and r are such numbers that q/(q+r) is from 0.05 to 0.8, said polyhydroxystyrene having a weight average molecular weight of 1,000 to 50,000, the hydrogen atom of the hydroxyl group in a molecule being partially protected by an acid labile group such that a degree of substitution represented by q/(q+r) ranges from 0.05 to 0.8.

3. The resist composition according to claim 1 wherein said acid labile group is at least one group selected from the group consisting of groups of the general formulae (11) and (12), linear or branched alkyl groups having 1 to 8 carbon atoms, tetrahydropyranyl groups, tetrahydrofuranyl groups, trialkylsilyl groups, and β-ketoalkyl groups:

$$-\underset{R^9}{\overset{R^8}{\underset{|}{\overset{|}{C}}}}-O-R^{10} \quad (11)$$

$$-(CH_2)_x-\overset{O}{\underset{\|}{C}}-OR^{11} \quad (12)$$

wherein $R^8$ and $R^9$ are independently hydrogen or a linear or branched alkyl group having 1 to 6 carbon atoms, $R^{10}$ is a linear, branched or cyclic alkyl group having 1 to 10 carbon atoms, $R^{11}$ is a linear or branched alkyl group having 1 to 6 carbon atoms, and letter x is equal to 0 or 1.

4. A chemically amplified positive resist composition comprising:

(a) an organic solvent;

(b) an acid labile group-protected resin which is slightly soluble or insoluble in alkali and becomes alkali soluble by elimination of the acid labile group;

(c) a photoacid generator;

(d) a dissolution controller, said dissolution controller being a compound having a weight average molecular weight of 100 to 1,000 and at least two phenolic groups in a molecule selected from the group consisting of compounds of the following general formulae (1) to (9):

wherein $R^1$ and $R^2$ are independently selected from the group consisting of hydrogen and normal or branched alkyl and alkenyl groups having 1 to 8 carbon atoms, $R^3$ is selected from the group consisting of hydrogen, normal or branched alkyl and alkenyl groups having 1 to 8 carbon atoms, and $(R^7)_s$—COOH, $R^4$ is selected from the group consisting of a group represented by —(CH$_2$)$_t$— wherein t is an integer of 2 to 10, arylene group having 6 to 10 carbon atoms, carbonyl group, sulfonyl group, oxygen atom, and sulfur atom, $R^5$ is selected from the group consisting of an alkylene group having 1 to 10 carbon atoms, arylene group having 6 to 10 carbon atoms, carbonyl group, sulfonyl group, oxygen atom, and sulfur atom, $R^6$ is selected from the group consisting of an alkyl group having 1 to 8 carbon atoms, alkenyl group, hydrogen atom, hydroxyl-substituted phenyl and naphthyl groups, $R^7$ is a normal or branched alkylene group having 1 to 10 carbon atoms, letter k is an integer of 0 to 5, s is 0 or 1.

m, n, m', n', m", and n" are numbers satisfying m+n=8, m'+n'=5, and m"+n"=4 such that at least one hydroxyl group is attached to each phenyl skeleton, and p is such a number of at least 2 as to provide a weight average molecular weight of 100 to 1,000, the hydrogen atom of the phenolic hydroxyl group being partially replaced by an acid labile group in an overall average proportion of 10 to 80%.

2. The resist composition of claim 1 wherein said acid labile group-protected resin (B) is a polyhydroxystyrene of the following general formula (10):

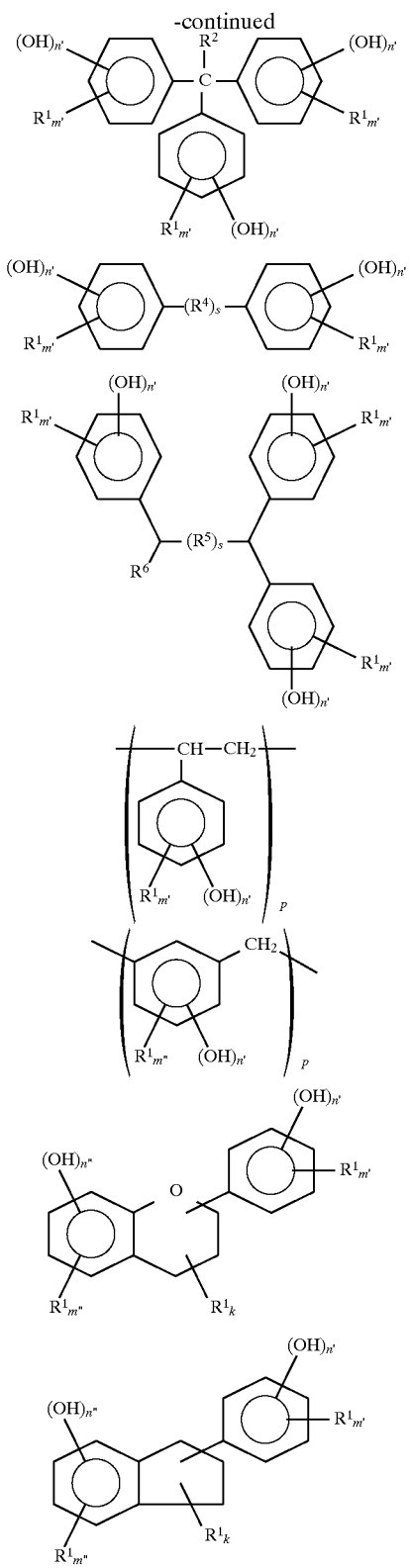

wherein $R^1$ and $R^2$ are independently selected from the group consisting of hydrogen and normal or branched alkyl and alkenyl groups having 1 to 8 carbon atoms, $R^3$ is selected from the group consisting of hydrogen, normal or branched alkyl and alkenyl groups having 1 to 8 carbon atoms, and $(R^7)_s$—COOH, $R^4$ is selected from the group consisting of a group represented by —$(CH_2)_t$— wherein t is an integer of 2 to 10, arylene group having 6 to 10 carbon atoms, carbonyl group, sulfonyl group, oxygen atom, and sulfur atom, $R^5$ is selected from the group consisting of an alkylene group having 1 to 10 carbon atoms, arylene group having 6 to 10 carbon atoms, carbonyl group, sulfonyl group, oxygen atom, and sulfur atom, $R^6$ is selected from the group consisting of an alkyl group having 1 to 8 carbon atoms, alkenyl group, hydrogen atom, hydroxyl-substituted phenyl and naphthyl groups, $R^7$ is a normal, or branched alkylene group having 1 to 10 carbon atoms, letter k is an integer of 0 to 5, s is 0 or 1, m, n, m', n', m", and n" are numbers satisfying m+n=8, m'+n'=5, and m"+n"=4 such that at least one hydroxyl group is attached to each phenyl skeleton, and p is such a number of at least 2 as to provide a weight average molecular weight of 100 to 1,000, the hydrogen atom of the phenolic hydroxyl group being partially replaced by an acid labile group in an overall average proportion of 10 to 80%.

5. The resist composition according to claim 4 wherein said acid labile group is at least one group selected from the group consisting of groups of the general formulae (11) and (12), linear or branched alkyl groups having 1 to 8 carbon atoms, tetrahydropyranyl groups, tetrahydrofuranyl groups, trialkylsilyl groups, and β-ketoalkyl groups:

wherein $R^8$ and $R^9$ are independently hydrogen or a linear or branched alkyl group having 1 to 6 carbon atoms, $R^{10}$ is a linear, branched or cyclic alkyl group having 1 to 10 carbon atoms, $R^{11}$ is a linear or branched alkyl group having 1 to 6 carbon atoms, and letter x is equal to 0 or 1.

6. The resist composition of claim 4, wherein said acid labile group-protected resin (B) is a polyhydroxystyrene of the following general formula (10):

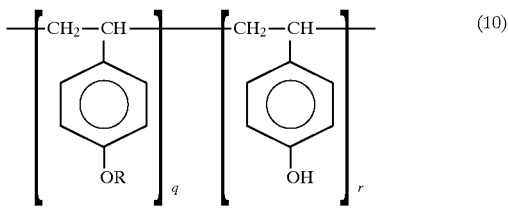

wherein R is an acid labile group and letters q and r are such numbers that q/(q+r) is from 0.05 to 0.08, said polyhydroxystyrene having a weight average molecular weight of 1,000 to 50,000, the hydrogen atom of the hydroxyl group in a molecule being partially protected by an acid labile group such that a degree of substitution represented by q/(q+r) ranges from 0.05 to 0.8.

7. A chemically amplified positive resist composition comprising:

(A) an organic solvent, (B) an acid labile group-protected resin which is slightly soluble or insoluble in alkali and becomes alkali soluble by elimination of the acid labile group, (C) a dissolution inhibitor, (D) a photoacid generator, (E) a dissolution controller, wherein the dissolution comprises a compound having a weight average molecular weight of 100 to 1,000 and at least two phenolic hydroxyl groups in a molecule, the hydrogen atom of the phenolic hydroxyl group being partially replaced by an acid labile group in an overall average proportion of 10 to 80%.

8. The resist composition of claim 7, wherein said acid labile group-protected resin (B) is a polyhydroxystyrene of the following general formula (10):

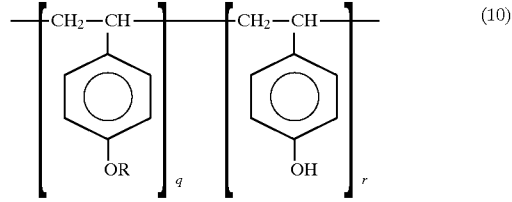

wherein R is an acid labile group and letters q and r are such numbers that q/(q+r) is from 0.05 to 0.08, said polyhydroxystyrene having a weight average molecular weight of 1,000 to 50,000, the hydrogen atom of the hydroxyl group in a molecule being partially protected by an acid labile group such that a degree of substitution represented by q/(q+r) ranges from 0.05 to 0.8.

* * * * *